(12) United States Patent
deFresart et al.

(10) Patent No.: US 7,833,858 B2
(45) Date of Patent: Nov. 16, 2010

(54) SUPERJUNCTION TRENCH DEVICE FORMATION METHODS

(75) Inventors: Edouard D. deFresart, Tempe, AZ (US); Robert W. Baird, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/511,849

(22) Filed: Jul. 29, 2009

(65) Prior Publication Data

US 2009/0286372 A1 Nov. 19, 2009

Related U.S. Application Data

(62) Division of application No. 11/510,547, filed on Aug. 25, 2006, now Pat. No. 7,598,517.

(51) Int. Cl.
*H01L 29/94* (2006.01)
(52) U.S. Cl. .................. 438/242; 438/217; 438/454
(58) Field of Classification Search ............... 257/28, 257/302, 347, 403, 404, 409; 438/140, 217, 438/242, 454
See application file for complete search history.

(56) References Cited

U.S. PATENT DOCUMENTS 4,754,210 A 6/1988 Taghezout 5,216,275 A 6/1993 Chen
5,438,215 A 8/1995 Tihanyi (Continued)

FOREIGN PATENT DOCUMENTS

JP 2003008014 1/2003

OTHER PUBLICATIONS

Fujihira, "Theory of Semiconductor Superjunction Devices," Jpn J. Appl. Phys., vol. 36 (1997), pp. 6254-6262.

(Continued)

*Primary Examiner*—Roy K Potter
(74) *Attorney, Agent, or Firm*—Ingrassia, Fisher & Lorenz, P.C.

(57) ABSTRACT

Methods for forming semiconductor structures are provided for a semiconductor device employing a superjunction structure and overlying trench with embedded control gate. An embodiment comprises forming interleaved first and second spaced-apart regions of first and second semiconductor materials of different conductivity type and different mobilities so that the second semiconductor material has a higher mobility for the same carrier type than the first semiconductor material, and providing an overlying third semiconductor material in which a trench is formed with sidewalls having thereon a fourth semiconductor material that has a higher mobility than the third material, adapted to carry current between source regions, through the fourth semiconductor material in the trench and the second semiconductor material in the device drift space to the drain. In a further embodiment, the first and third semiconductor materials are relaxed materials and the second and fourth semiconductor materials are strained semiconductor materials.

20 Claims, 9 Drawing Sheets

U.S. PATENT DOCUMENTS

| | | | |
|---|---|---|---|
| 6,097,063 | A | 8/2000 | Fujihira |
| 6,274,904 | B1 | 8/2001 | Tihianyi |
| 6,291,856 | B1 | 9/2001 | Miyasaka et al. |
| 6,294,818 | B1 | 9/2001 | Fujihira |
| 6,828,628 | B2 | 12/2004 | Hergenrother et al. |
| 6,960,781 | B2 | 11/2005 | Currie et al. |
| 7,355,224 | B2 | 4/2008 | Cai |
| 2002/0027237 | A1 | 3/2002 | Onishi et al. |
| 2004/0113200 | A1 | 6/2004 | Kobayashi et al. |

OTHER PUBLICATIONS

Fujihira, and Miyasaka, "Simulated Superior Performance of Semiconductor Superjunction Devices," Proc. of 1998 Symposium on Power Semiconductor Devices & ICs, Kyoto, Japan, pp. 423-426.

Strollo and Napoli, "Optimal ON-Resistance Versus Breakdown Voltage Tradeoff in Superjunction Power Devices. A Novel Analytical Model," IEEE Transactions on Electron Devices, Vo. 48, No. 9, Sep. 2001, pp. 2161-2167.

Deboy, Gerald, "The Superjunction Principle as Enabling Technology for Advanced Power Solutions", IEEE ISIE 2005, Jun. 20-23, 2005, Dubrovnik, Croatia, pp. 469-472.

Udrea, Florin, Advanced 3D RESURF XDevices for Power integrated Circuit, IEEE, 2002, 229-238.

News Release Digest, Hitachi, Ltd., Research and Development Group, Tokyo, Japan, dated Jun. 17, 2005, "Concerning Use of Strained Silicon in Analog Semiconductor Devices".

Udrea, F., et al. A Class of lateral power devices for HVIC's based on the 3D RESURF concept, BCTM 1998 Proceedings, pp. 187-19.

SUPERJUNCTION TRENCH DEVICE FORMATION METHODS

CROSS-REFERENCE TO RELATED APPLICATION

This application is a divisional of co-pending U.S. patent application Ser. No. 11/510,547, filed on Aug. 25, 2006.

TECHNICAL FIELD

Embodiments generally relate to semiconductor structures, and more particularly relate to methods for forming trench-type semiconductor structures incorporating a superjunction.

BACKGROUND

Superjunction structures are well known in the art and are described, for example, by Fujihira, "Theory of Semiconductor Superjunction Devices," *Jpn J. Appl. Phys.*, Vol. 36 (1997), pp. 6254-6262; Fujihira and Miyasaka, "Simulated Superior Performance of Semiconductor Superjunction Devices," *Proc. of 1998 Symposium on Power Semiconductor Devices & ICs, Kyoto, Japan*, pp. 423-426; Strollo and Napoli, "Optimal ON-Resistance Versus Breakdown Voltage Tradeoff in Superjunction Power Devices. A Novel Analytical Model," *IEEE Transactions on Electron Devices*, Vo. 48, No. 9, September 2001, pp. 2161-2167; and Gerald Deboy, "The Superjunction Principle as Enabling Technology for Advanced Power Solutions", *IEEE ISIE* 2005, Jun. 20-23, 2005, *Dubrovnik, Croatia*, pages 469-472. In its simplest form, superjunction structures employ a number of alternatively arranged P and N doped semiconductor layers or regions, with the condition that the doping of these layers are charge-balanced, or Na*Wa=Nd*Wd, in which Na and Nd are the doping concentrations of the P and N layers, and Wa, Wd, the widths of these same layers. Current flow through such superjunction structures is for the most part parallel to the planes of the P-N junctions. Superjunction structures are often employed in high voltage (and high power) semiconductor (SC) devices in order to obtain comparatively high breakdown voltages while minimizing series ON-resistance. The superjunction structures facilitate this desirable combination of properties. Superjunction devices are also available on the open market, as for example, the CoolMOS™ family of devices produced by Infineon of Villach, Austria.

It is known to utilize superjunction structures in trench-type power devices. FIG. 1 illustrates prior art N-channel trench-type metal-oxide-semiconductor (Trench-MOS) device 20 employing superjunction structure 21 in drift space 22 between trench-type channels 23 and drain 29. Device 20 comprises N+ substrate (e.g., drain) 29 on which has been formed superjunction structure 21 comprising multiple parallel vertically arranged N-type regions 25 and P-type regions 26, of for example silicon, with intervening PN junctions 27. Lower portion 28 of superjunction structure 21 contacts substrate 29, which together with electrical contact 291 forms the drain of Trench-MOS device 20. P-type body region 32 is located above drift space 22 comprising superjunction structure 21. Trench 31 extends from upper surface 39 through body region 32 to upper portion 35 of superjunction structure 21. Trench 31 is lined with gate dielectric (e.g., SiO$_2$) 36. The interior portion of trench 31 within gate dielectric 36 is filled with gate (e.g., doped poly-silicon) 38 having gate contact 381. N+ source regions 34 with source contacts 341 are formed in P-type body region 32 on either side of trench 31, insulated from gate 38 by gate dielectric 36. When appropriately biased, source-drain current 30 (abbreviated as "I$_D$") flows from source contact 341 and sources 34 through substantially vertical channels 23 in P-type body region 32 into drift space 22 formed by N-type regions 25 of superjunction structure 21 to drain region 29 and drain contact 291. Long dimension 37 of trench 31, gate 38 and sources 34 is substantially perpendicular to the planes of parallel N and P regions 25, 26 and intervening PN-junctions 27 of superjunction structure 21.

While the structure illustrated in FIG. 1 is useful, it is desirable to improve its properties. Accordingly, there is a need for improved device structures and methods of fabrication that can provide improved performance. It is desirable to provide trench and superjunction type semiconductor devices that offer, for example, improved carrier mobility while still being able to be fabricated using conventional processing equipment and process chemistry. Further it is desirable to provide an improved device structure and method of fabrication that is useful with a variety of semiconductor materials. Furthermore, other desirable features and characteristics of the various embodiments will become apparent from the subsequent detailed description and the appended claims, taken in conjunction with the accompanying drawings and the foregoing technical field and background.

BRIEF DESCRIPTION OF THE DRAWINGS

Embodiments will hereinafter be described in conjunction with the following drawing figures, wherein like numerals denote like elements.

DETAILED DESCRIPTION

Figure 1:
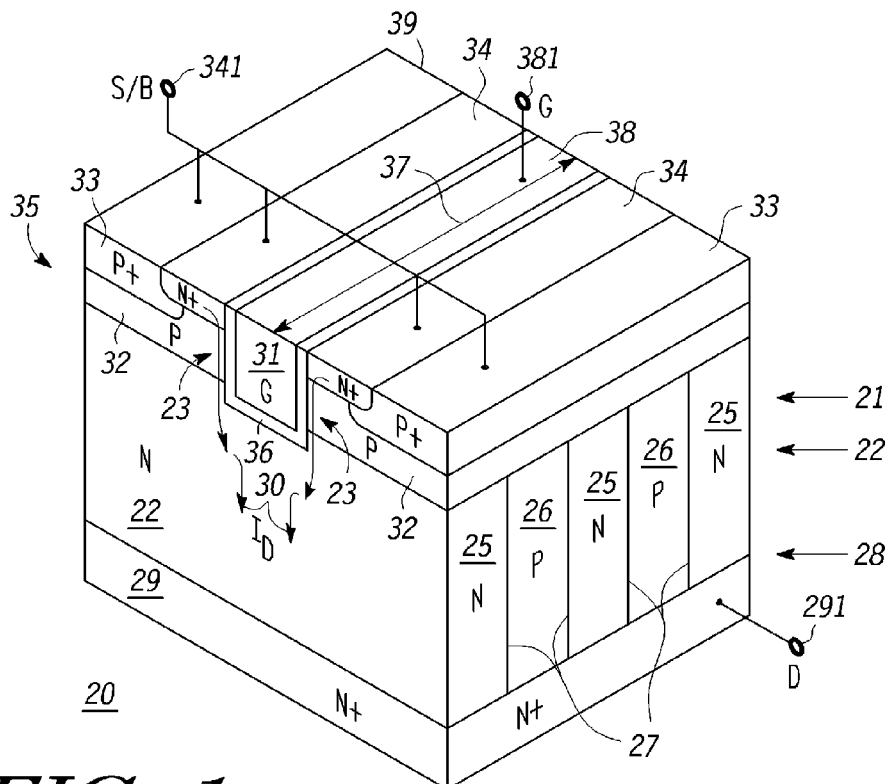
FIG. 1 is a simplified schematic perspective view of a prior art trench-type semiconductor device employing a conventional superjunction structure.

The following detailed description is merely exemplary in nature and is not intended to limit the inventive subject matter or the application and uses of the inventive subject matter. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the inventive subject matter. Additionally, elements in the drawings figures are not necessarily drawn to scale. For example, the dimensions of some of the elements or regions in some of the figures may be exaggerated relative to other elements or regions of the same or other figures to help improve understanding of embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments described herein may be used, for example, in other orientations than those illustrated or otherwise described herein. The term "coupled," as used herein, is defined as directly or indirectly connected in an electrical or non-electrical manner.

For convenience of explanation and not intended to be limiting, embodiments are described for superjunction structures formed using Si and Ge as exemplary semiconductor materials, but the embodiments are not limited merely to this combination of materials. The principles taught herein apply to a wide variety of semiconductor materials of different lattice constants and/or band gaps that can be combined to produce regions of improved mobility in the active regions of the devices. Non-limiting examples of other suitable semiconductor material combinations are GaN and Si, SiGe and GaAs, GaAs and Ge, Si and $Si_{1-y}C_y$, SiC and AlN, SiC and BP, InGaN and GaN, and various other type IV, III-V and II-VI compounds and mixtures thereof and organic semiconductors. Accordingly, while Si and Ge are identified as a suitable pair of semiconductor materials to obtain the improved properties described herein, embodiments are not limited thereto.

Figure 2:
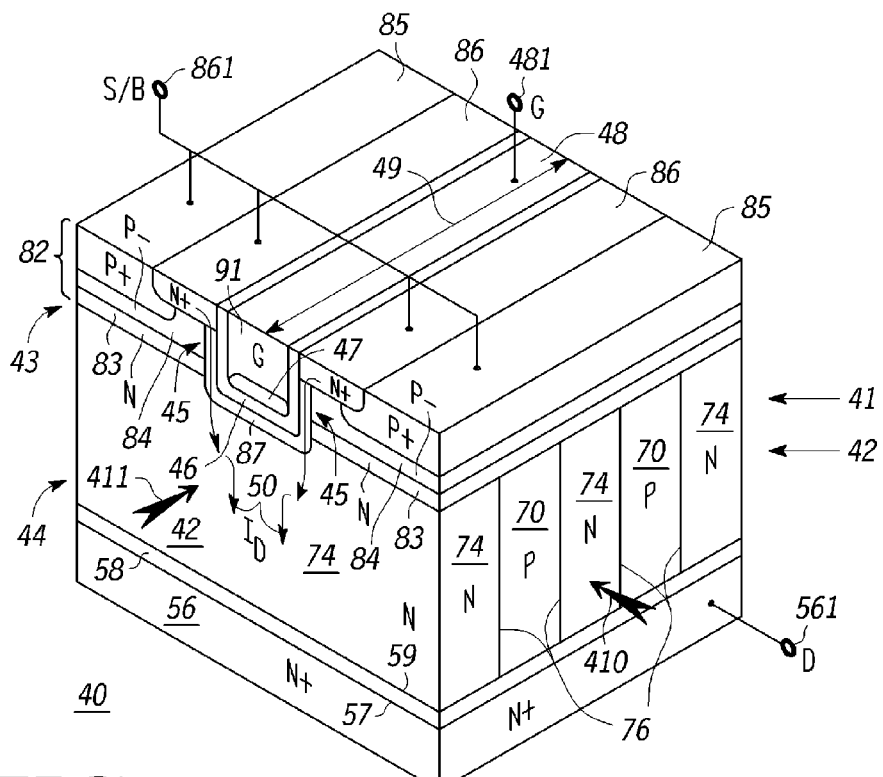
FIG. 2 is a simplified schematic perspective view of a trench-type semiconductor device employing a superjunction structure, according to a first embodiment.

FIG. 2 is a simplified schematic perspective view of trench-type semiconductor device 40 employing superjunction structure 41 in drift space 42, according to an embodiment. For convenience of explanation an N-channel trench-type metal-oxide-semiconductor (Trench-MOS) semiconductor device is described. Device 40 employs superjunction structure 41 in drift space 42 between trench-type channels 45 and substrate drain 56. Device 40 comprises N+ substrate (e.g., drain) 56, of for example, silicon, on which has been formed transition or buffer layer 58 of varying composition, as is described in detail in connection with FIG. 3. Superjunction structure 41 comprises multiple parallel vertically arranged P-type regions 70 and N-type regions 74 with intervening PN junctions 76. Lower portion 44 of superjunction structure 41 contacts buffer layer 58 which in turn contacts substrate 56, which together with electrical contact 561 forms the drain of Trench-MOS device 40. Superjunction structure 41 of device 40 of FIG. 2 differs from superjunction structure 21 of device 20 of FIG. 1 in that P-type regions 70 and N-type regions 74 are made from different materials, chosen so that the mobility of the principal current carriers in drift space 42 through superjunction 41 is higher than what would otherwise be obtained using a homogenous material (with different doping for the N and P regions) for superjunction structure 41. In a preferred embodiment for constructing an N-channel device, P-type regions 70 are formed from relaxed SiGe and N-type regions 74 are formed from strained Si, as is described for example in connection with FIGS. 3-10. Strained Si has an electron mobility that is about twice that of ordinary relaxed silicon as is typically found in prior art superjunction structure 21. Since the $R_{DS}ON$ for such devices is inversely proportional to the electron mobility in drift space 42, doubling the principal carrier mobility in device 42 will significantly lower the device $R_{DS}ON$, which is highly advantageous.

Region 82 located substantially above superjunction structure 41 comprises N-region 83 in contact with upper portion 43 of superjunction structure 41 and P-type body region 84 extending from N-region 83 to upper surface 88 of device 40. Trench 91 extends from upper surface 88 through body region 84 and through N-region 83 to upper portion 43 of superjunction structure 41. In an alternative embodiment, trench 91 extends from upper surface 88 through body region 84 alone, making contact with N-region 83. Sidewalls 89 of trench 91 are formed from higher mobility material 87 compared to the material of body region 84. For example and not intended to be limiting, body region 84 is conveniently formed of relaxed SiGe and material 87 is conveniently of strained silicon. In this way, channels 45 of device 40 preferentially form in higher mobility material 87, and the device ON-resistance is further reduced compared to prior art device 20. Trench 91 is lined with gate dielectric (e.g., $SiO_2$) 46 analogous to gate dielectric 36 of FIG. 1. The interior portion of trench 91 within gate dielectric 46 is filled with gate (e.g., doped polysilicon) 48 having gate contact 481. N+ source regions 86 with source contact 861 are formed in P-type body region 84 on either side of trench 91, in much the same manner as for source regions 34 of FIG. 1, insulated from gate 48 by gate dielectric 46. When appropriately biased, source-drain current 50 (abbreviated as "$I_D$") flows from source contact 861 and source regions 86 through substantially vertical channels 45 in higher mobility material 87 on trench sidewalls 89 of P-type body region 84 into drift space 42 formed by N-type regions 74 of superjunction structure 41 to drain region 56 and drain contact 561. Long dimension 49 of trench 91, gate 48, source regions 86 and body contact regions 85 is substantially perpendicular to the planes of parallel N and P regions 70, 74 and intervening PN-junctions 76 of superjunction structure 41. Body contact regions 85 are conveniently but not essentially coupled to source regions 86 and source contact 861. The structure illustrated in FIG. 2 will be understood more fully in connection with FIGS. 3-18 following.

FIGS. 3-17 are simplified schematic cross-sectional views of a trench-type semiconductor device employing a superjunction structure, according to further embodiments, at different stages of manufacture 52-3 through 52-17. Manufacturing stages 52-3 through 52-10 shown respectively in FIGS. 3-10 illustrate embodiments useful for formation of superjunction structure 41 in drift space 42 of device 40 of FIG. 2, and are views looking substantially in direction 410 in FIG. 2. Manufacturing stages 52-11 through 52-17 of FIGS. 11-17 illustrate further embodiments useful for formation of trench portion 82 of device 40 of FIG. 2 in combination with superjunction structure 41, and are views looking substantially in direction 411 if FIG. 2. In a preferred embodiment, directions 410 and 411 are substantially orthogonal but this is not essential. However, for convenience of explanation, it is assumed hereafter that directions 410 and 411 are substantially orthogonal but this not is intended to be limiting.

Figure 3:
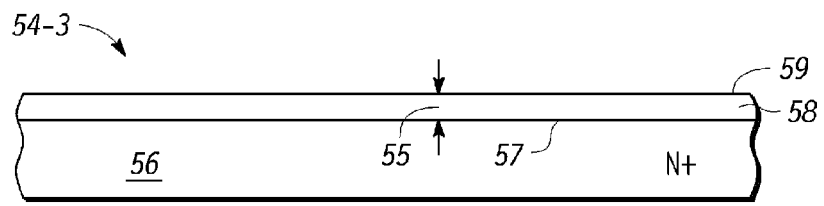
FIGS. 3-17 are simplified schematic cross-sectional views of trench-type semiconductor devices employing a superjunction structure, according to further embodiments, at different stages of manufacture.

Referring now to FIG. 3 illustrating manufacturing stage 52-3, structure 54-3 of FIG. 3 comprises substrate 56 conveniently about 0.05 to 0.5 mm thickness with upper surface 57 on which is formed buffer layer 58 having upper surface 59. The choice between N or P doping of substrate 56 and buffer layer 58 will depend upon the particular type of device that is being fabricated. For example, in the case of an N-channel Trench-MOS device, such as is shown by way of example herein, substrate 56 is desirably N+. For an insulated gate bipolar transistor (IGBT) type of device, substrate 56 is desirably P+. For a P-channel Trench-MOS device, substrate 56 is desirably P+. Persons of skill in the art will understand how to choose the doping type of substrate 56 according to the type of device they wish to fabricate and use of N+ for substrate 56 herein by way of example is not intended to be limiting. Buffer layer 58 is conveniently, for example, either N or P-type according to the conductivity type of substrate 56 and preferably of graded SiGe with thickness 55 of about 1 to 5 micrometers. For convenience of explanation, it is assumed in connection with FIGS. 3-18 that layer 58 and substrate 56 are both N-type as would be used in forming an N-channel Trench-MOS device, but this is not essential. Chemical vapor deposition (CVD), low pressure chemical vapor deposition (LPCVD), and molecular beam epitaxy (MBE) are well known methods useful for forming layer 58. LPCVD is preferred. The purpose of buffer layer 58 is to provide a transition zone from semiconductor (SC) substrate 56 of a suitable substrate material, e.g., silicon, having a first lattice constant, to further semiconductor (SC) materials having different lattice constants that are applied in subsequent steps so as to provide the desired regions of improved mobility. In the case of Si and SiGe mixtures, when substrate 56 is silicon, layer 58 is desirably graded from substantially pure Si at surface 57 (e.g., 100% Si) to a X % Si to Y % Ge mixture at surface 59, where the ratio X:Y at surface 59 is usefully in the range of about 60:40 to 95:05, more conveniently about 70:30 to 90:10 and preferably about 80:20.

Figure 4:
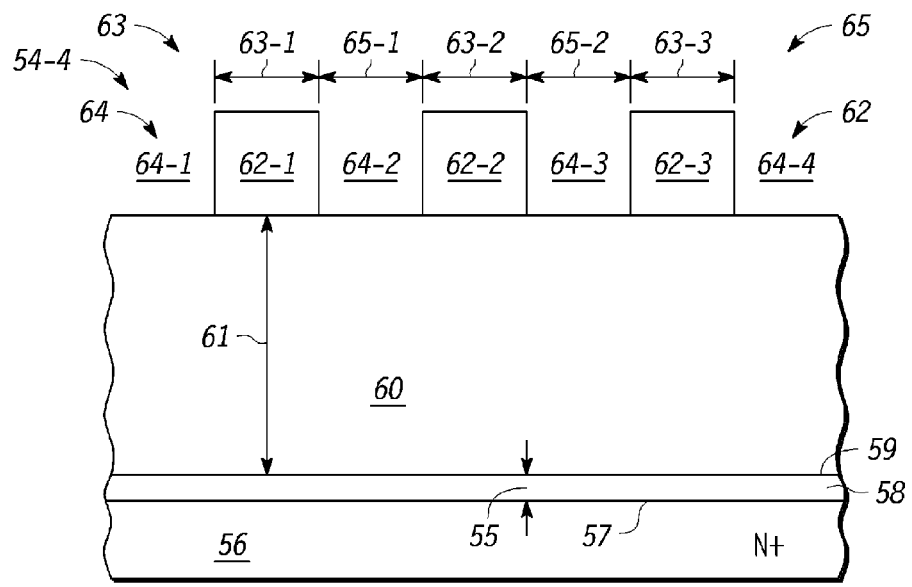

In FIG. 4 showing manufacturing stage 52-4 and resulting structure 54-4, substantially uniform refractory mask layer 60 having thickness 61 is applied on surface 59. Thickness 61 can be used to determine the (vertical) extent of superjunction structure 41 in the direction of conduction of source-drain current 50 (see FIG. 2). Thickness 61 in the range of about 2 to 50 micrometers is useful, with the exact range being dependent upon the targeted breakdown voltage. Persons of skill in the art will understand how to choose the thickness range that best suits their particular design targets. Silicon dioxide is a non-limiting example of a suitable material for mask layer 60, but other generally refractory inert materials can also be used. Non-limiting examples, of other useful materials for mask layer 60 are low temperature silicon oxide (LTO), oxide formed by plasma enhanced reaction of tetra-ethyl-orthosilicate (PETEOS), silicon nitride, combinations thereof, etc. Etch mask 62 of, for example, photo-resist, is applied over layer 60 and patterned to provide protected areas 62-1, 62-2, 62-3 etc., of widths 63-1, 63-2, 63-3, etc., (collectively widths 63) separated by openings 64-1, 64-2, 64-3, 64-4, etc., (collectively openings 64) of widths 65-1, 65-2, etc., (collectively widths 65). Protected areas of etch mask 62 of widths 63 and openings 64 of widths 65 will determine the thicknesses (widths) of the parallel, oppositely-doped layers of eventual superjunction structure 41.

Figure 5:
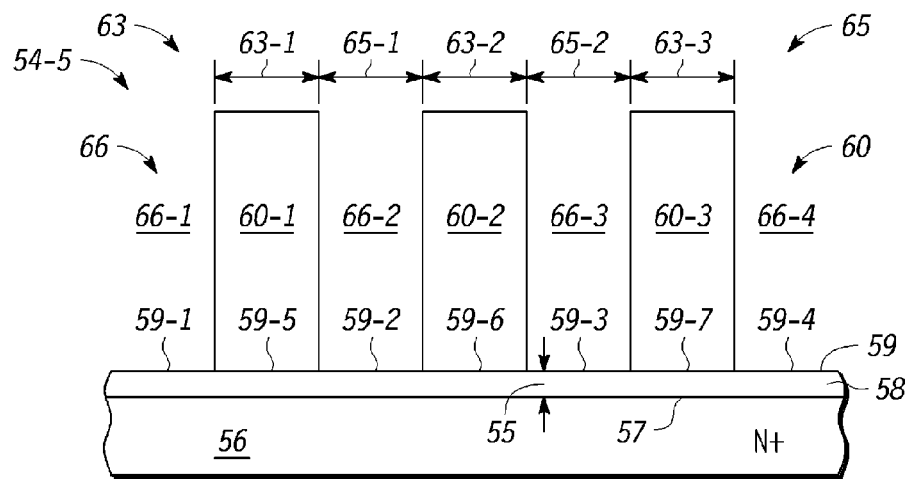

Referring now to FIG. 5 showing manufacturing stage 52-5 and resulting structure 54-5, layer 60 is etched using mask 62 to provide spaced-apart regions 60-1, 60-2, 60-3, etc., corresponding to protected areas 62-1, 62-2, 62-3, etc., separated by spaces 66-1, 66-2, 66-3, 66-4, etc., corresponding to openings 64. Regions 59-1, 59-2, 59-3, etc., of surface 59 of transition layer 58 are exposed in spaces 66-1, 66-2, 66-3, 66-4, etc, (collectively 66). Regions 59-5, 59-6, 59-7, etc., of surface 59 of transition layer 58 remain covered by portions 60-1, 60-2, 60-3, etc., of layer 60.

Figure 6:
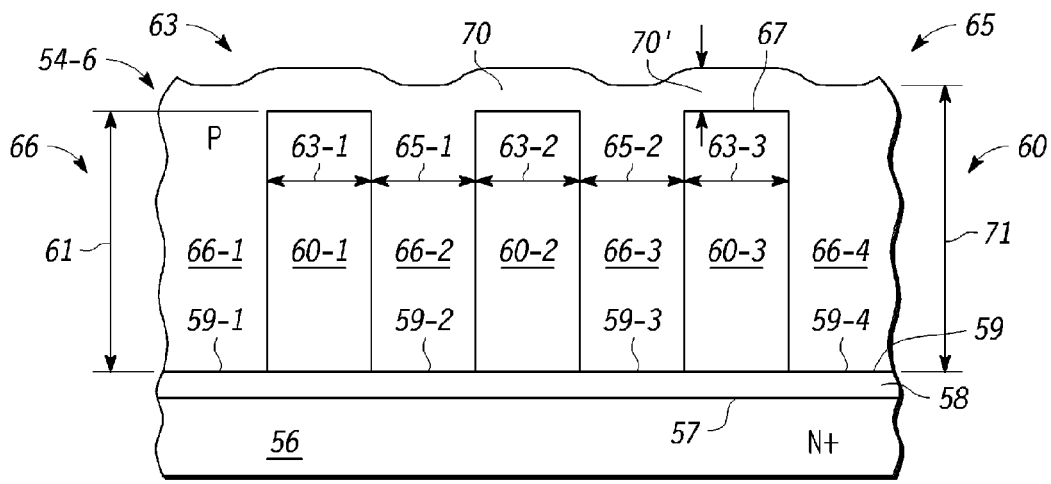

Referring now to FIG. 6 showing manufacturing stage 52-6 and resulting structure 54-6, first semiconductor material 70 is epitaxially grown or deposited on exposed regions 59-1, 59-2, 59-3, 59-4, etc., of surface 59 of transition layer 58 desirably but not essentially to thickness 71 equal or greater than thickness 61 of layer 60. Chemical vapor deposition (CVD), low pressure chemical vapor deposition (LPCVD), and atmospheric pressure chemical vapor deposition (APCVD), are well known methods useful for forming material 70. LPCVD is preferred. Relaxed SiGe is a non-limiting example of a suitable material for first semiconductor material 70 for use in connection with an N-channel device. Semiconductor material 70 is formed on surface 59 of transition layer 58. In the case of SiGe, material 70 is desirably a mixture of X % Si to Y % Ge, wherein X:Y is usefully in the range of about 60:40 to 95:05, more conveniently about 70:30 to 90:10 and preferably about 80:20, corresponding substantially to the composition mixture at surface 59 of buffer layer 58. Assuming by way of example, that substrate 56 is single crystal silicon with surface 57 having, for example, [100] orientation, then layer 58 is desirably graded in composition from substantially 100% Si at surface 57 to the desired SiGe composition ratio of layer 70 at surface 59. This insures that when SiGe material 70 of substantially the same composition is grown on surface regions 59-1, 59-2, 59-3, 59-4, etc., of surface 59, that the resulting SiGe regions 70-1, 70-2, 70-3, 70-4, etc., will be substantially strain free, i.e., "relaxed." It is desirable to dope SC material 70 during deposition according to the desired device functions. In the example presented in FIGS. 6-11, SC material 70 is desirably P-doped to concentrations usefully about 1E15 to 1E19, depending on the targeted breakdown voltage. In manufacturing stage 52-7 of FIG. 7, structure 54-6 of FIG. 6 is planarized so that excess portion 70' if any of region 70 lying above upper surface 67 of mask 60 is removed. Chemical-mechanical polishing (CMP) is a well known suitable technique. Structure 54-7 shown in FIG. 7 results. Persons of skill in the art will understand that it is not essential that thickness 71 exceed thickness 61 of mask layer 60, since even if thickness 71 is less than thickness 61, structure 54-7 may be obtained during planarizing step 52-7 by removing any excess material of mask layer 60.

Figure 7:
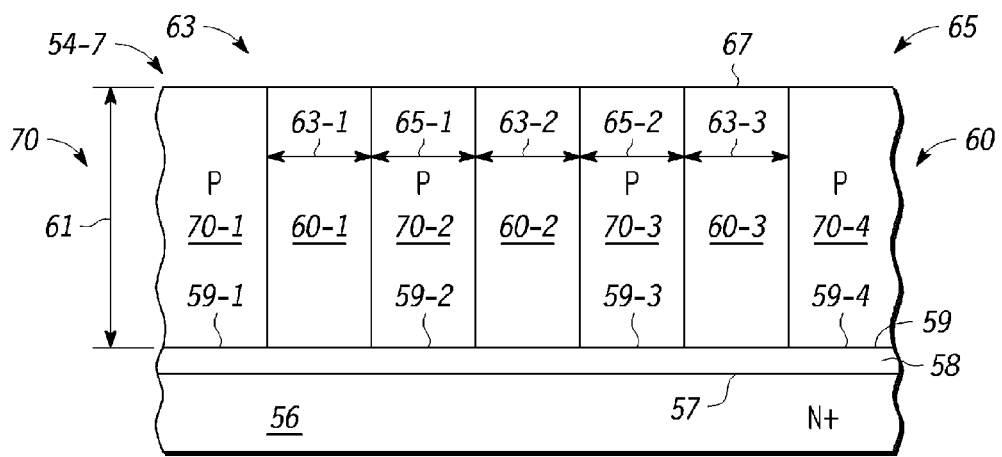
Figure 8:
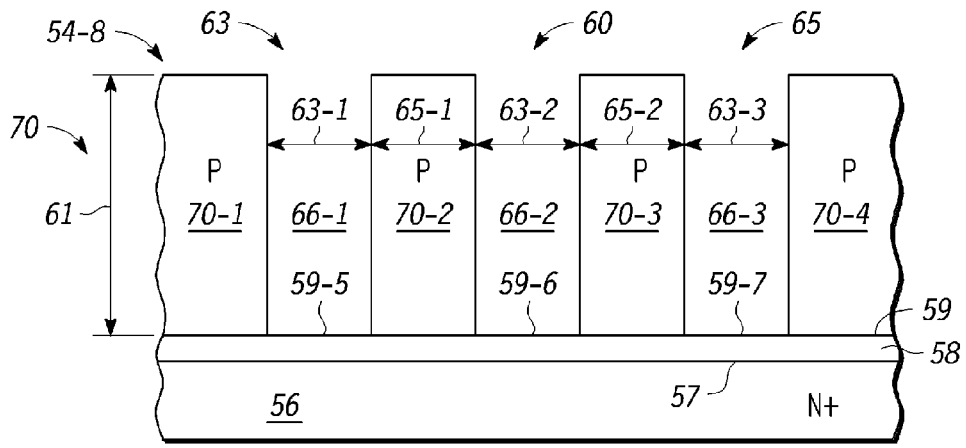
Figure 9:
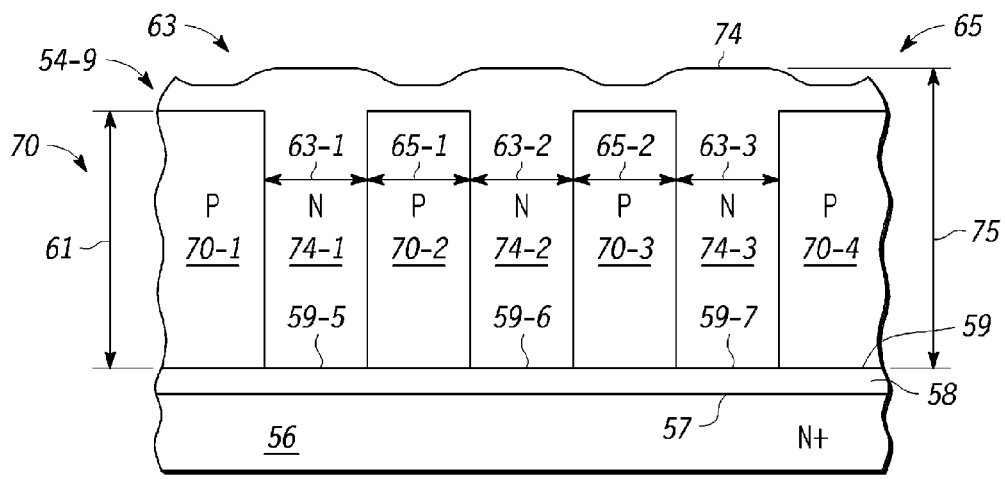

In manufacturing stage 52-8 shown in FIG. 8, structure 54-7 of FIG. 7 is etched to substantially remove remaining portions 60-1, 60-2, 60-3, etc., of mask layer 60, thereby exposing previously protected regions 59-5, 59-6, 59-7, etc., of surface 59 of transition layer 58 in spaces (i.e., trenches) 66-1, 66-2, 66-3, etc., (collectively trenches 66). Selective etching that removes remaining portions of mask 60 without significantly attacking material 70 is preferred. Structure 54-8 with trenches 66 results. In manufacturing stage 52-9 of FIG. 9, second semiconductor (SC) material 74 is deposited in trenches 66, thereby forming SC regions 74-1, 74-2, 74-3, etc., lying between SC regions 70-1, 70-2, 70-3, 70-4, etc. Layer 74 is desirably epitaxially grown on exposed regions 59-5, 59-6, 59-7, etc., of surface 59 of transition layer 58, desirably but not essentially to thickness 75 equal or greater than thickness 61 of layer 60. Chemical vapor deposition (CVD), low pressure chemical vapor deposition (LPCVD), and atmospheric pressure chemical vapor deposition (APCVD) are well known methods useful for forming material 74. LPCVD is preferred. In manufacturing stage 52-10 of FIG. 10, structure 54-9 is desirably planarized in generally the same manner as described in connection with FIG. 7. Structure 54-10 results.

Non-relaxed (e.g., "strained") silicon is a non-limiting example of a suitable SC material for second SC material 74 in combination with first (e.g., "relaxed") semiconductor (e.g., SiGe) material 70, but this is not intended to be limiting. What is convenient is that SC material 74 be strained relative to SC material 70, for example as a consequence of having a different lattice constant because of its different composition.

Thus, SC materials 70 and 74 should be sufficiently different in composition and/or crystal structure so that regions 74-1, 74-2, 74-3, etc., are strained with respect to regions 70-1, 70-2, 70-3, 70-4, etc. Assuming that material 70 is P-type, then material 74 should be N-type or vice-versa, that is, whatever the doping of first SC material 70, second SC material 74 should be of opposite conductivity type in order to provide improved superjunction structure 41 comprising interleaved regions 70, 74 of FIG. 10. For convenience of description regions 70-1, 70-2, 70-3, 70-4, etc., are labeled as P-type in FIGS. 6-11 and regions 74-1, 74-2, 74-3, etc., are labeled as N-type, but this is not intended to be limiting, and the illustrated doping types may be interchanged. Further, while the terms "first" SC material and "second" SC material are used herein in connection with materials 70 and 74 respectively, this is merely for purposes of identifying different materials or regions and does not imply that they must be applied in any particular order. Persons of skill in the art will understand based on the teachings herein that materials 70 and 74 and resulting interleaved regions 70-1, 70-2, 70-3, 70-4, etc., and 74-1, 74-2, 74-3, etc., of superjunction structure 41 may be formed in either order. By adjusting the composition of materials 70, 74 relative to surface 59 of transition layer 58, either material may be arranged to be relaxed or strained and either may be P or N type. Similarly, layer 58 may be P or N type or intrinsic, depending upon the type of device desired to be formed.

Stated another way, those portions of superjunction structure 41 that are intended to be the primary current carrying portions of drift space 42 of device 40 should be formed from a material having higher mobility than would be obtained from an otherwise homogeneous superjunction structure (e.g., all the same semiconductor material merely with different doping in the N and P regions). This is conveniently accomplished according to the above-described embodiment by providing strained semiconductor material in the current carrying drift space regions, e.g., regions 74 for an N-channel device, taking advantage of the increase in mobility obtainable with strained semiconductor material. For example, an improvement in electron mobility of a factor of about two can be obtained by using strained Si in N-type regions 74 of superjunction structure 41 of an N-channel Trench-MOS device relative to the unstrained SiGe of P-type regions 70 of superjunction structure 41 associated with the N-type Trench-MOS device. Stated still another way, an embodiment provides a trench-type semiconductor device including superjunction structure 41 of improved properties by using materials of different composition for the N and P regions of superjunction structure 41 so that the primary current carrying material (either N or P) in drift space 42 has higher mobility than what would otherwise be obtained using a homogeneous but differentially doped semiconductor material. Strained materials usually exhibit increased mobility for one type of carrier and decreased mobility for the opposite type of carrier depending upon whether they are in tension or compression. As explained in connection with the foregoing examples, the material combinations leading to tension or compression should be arranged so that the mobility increase for electrons occurs in the N-type drift regions of the superjunction structure for N-type devices and the mobility increase for holes occurs in the P type drift regions of the superjunction structure for P-type devices. While use of strained semiconductor to obtain the mobility increase is convenient, such mobility increase can also be obtained by using other higher mobility materials in the primary current carrying drift space of the superjunction structure. Thus, for N-channel devices, the higher mobility material should be used for the N-type regions of the superjunction structure and for P-channel devices, the higher mobility material should be used for the P-type regions of the superjunction structure. Thus, strained or unstrained material may be used provided that the carrier mobility is increased in the superjunction drift space portions where principal current conduction occurs.

Figure 10:
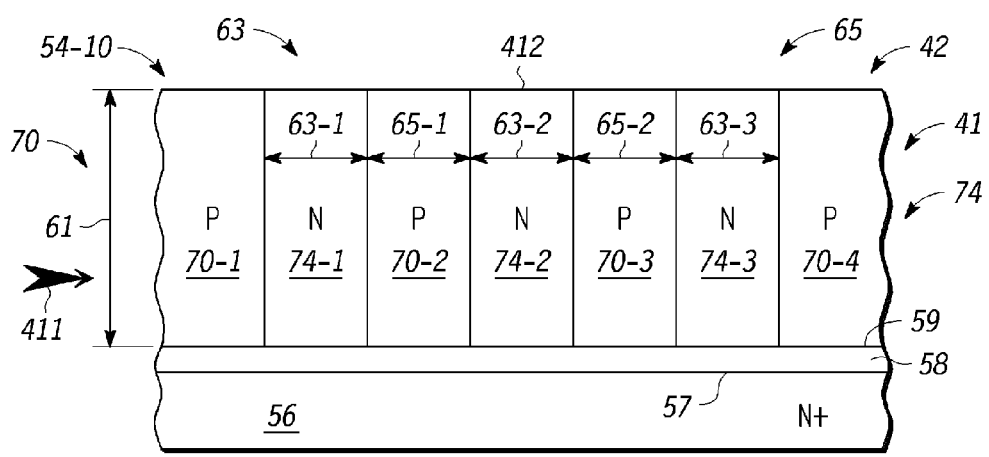
Figure 11:
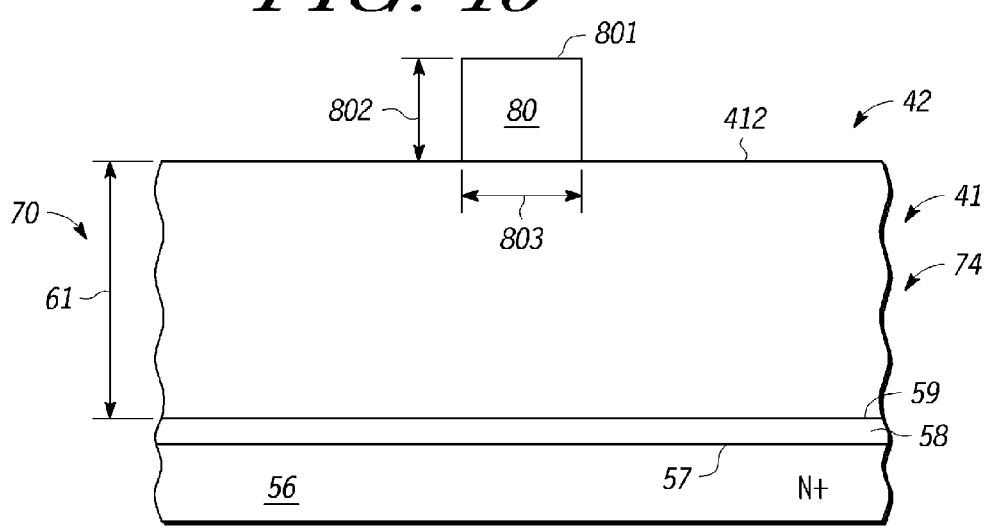

Manufacturing stages 52-11 through 52-17 of FIGS. 11-17 illustrate further embodiments useful for formation of trench portion 82 of device 40 of FIG. 2 in combination with superjunction structure 41, and are views looking substantially in direction 411 in FIGS. 2 and 10. FIGS. 11-18 are simplified schematic cross-sectional views of Trench-MOS semiconductor structures 54-11 through 54-17 at different stages 52-11 through 52-17 of manufacture, according to such further embodiments. For convenience of explanation, FIGS. 11-17 illustrate an N-channel device but this is merely by way of example and not intended to be limiting. Persons of skill in the art will understand that by interchanging the various dopant types, P-channel devices can also be made according to still further embodiments. Other types of devices, such as for example and not intended to be limiting, IGBT devices can also be fabricated using the principals taught herein. Referring now to manufacturing stage 52-11 of FIG. 11, structure 54-11 comprises structure 54-10 of FIG. 10 having upper surface 412 on which is formed pillar-shaped epi-growth mask 80. Epi-growth mask pillar 80 with upper surface 801, thickness 802 and width 803 is conveniently formed on upper surface 412 of superjunction structure 41. Silicon dioxide is a non-limiting example of a convenient material for epi-growth mask pillar 80, but other generally refractory materials adapted to withstand subsequent process steps may also be used. SiN, LTO, and TEOS are non-limiting examples of other suitable materials. Accordingly, use of the word "oxide" in connection with epi-growth mask pillar 80 is merely for convenience of identification and not intended to be limiting and should be understood to include such other alternatives. Pillar 80 is conveniently but not essentially formed by depositing a layer of oxide, masking the portion where pillar 80 is desired and etching away the remainder of the oxide layer. Chemical vapor deposition (CVD) or low pressure chemical vapor deposition (LPCVD) or plasma enhanced chemical vapor deposition (PECVD) are examples of suitable techniques for forming epi-growth mask pillar 80, but other formation techniques are not precluded. LPCVD is preferred. It is desirable to use an anisotropic etch process that preferentially etches substantially perpendicular to surface 412 rather than isotropically so as to leave pillar 80 of substantially uniform width 803 and height 802 on surface 412. It is also desirable to etch epi-growth mask pillar 80 selectively so as to leave underlying semiconductor surface 412 substantially unaffected. Structure 54-11 results.

Figure 12:
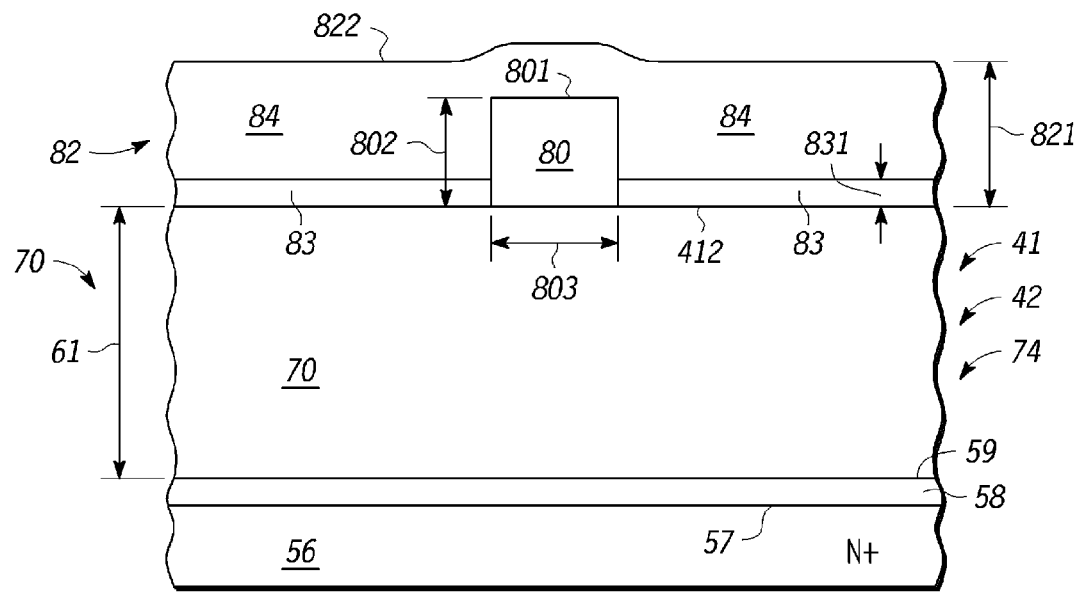
Figure 13:
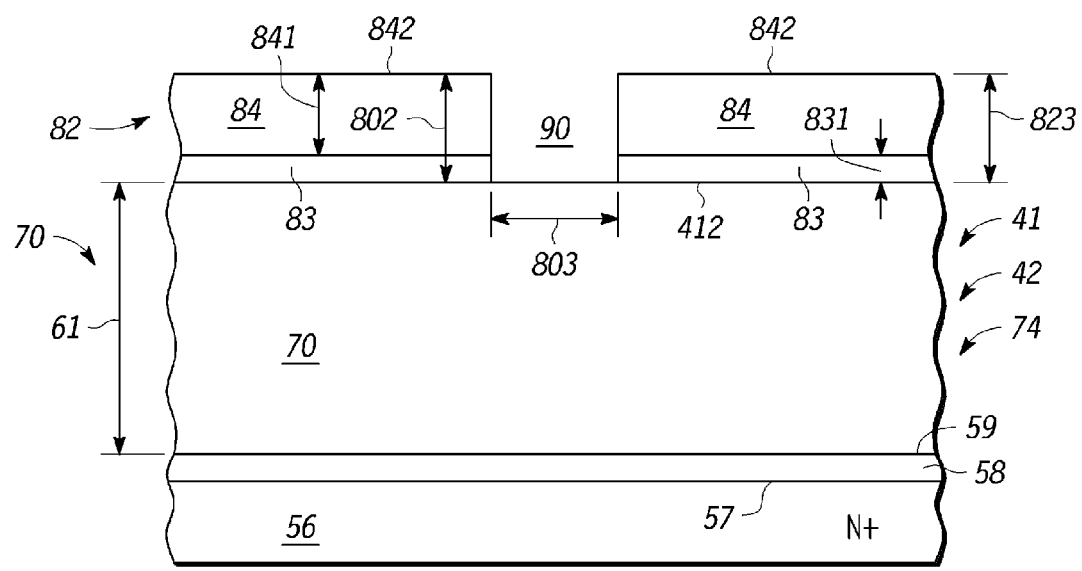

Referring now to manufacturing stage 52-12 of FIG. 12, trench portion 82 of relaxed semiconductor is deposited on surface 412 of superjunction structure 41, to thickness 821 desirably exceeding thickness or height 802. Portion 82 is conveniently formed of the same material as region 70. Portion 82 may be N or P type depending upon the particular device structure that is desired. Such doping does not significantly affect the lattice constant and band gap. Portion 82 desirably comprises initial (e.g., phosphorous doped) N-region 83 of about 0.05-0.15 micrometers thickness, preferably about 0.1 micrometers thickness, and doping densities usefully of about 5E15 to 1E17 per $cm^3$, depending on the desired breakdown voltage, followed by (e.g., boron doped) P-type body region 84 of sufficient thickness so that thickness 821 equals or exceeds thickness 802. Region 84 has doping densities usefully of about 1E17 to 1E18 per $cm^3$ and preferably about 2E17 to 5E17 per $cm^3$ but lower and higher doping density can also be used depending upon the particular device characteristics that are desired for the body formation. Portion 82 may be in-situ doped during formation or doped after formation using conventional doping techniques. Either arrangement is useful, depending upon the type of device being formed and whether graded or uniform doping is desired. Persons of skill in the art will understand how to choose appropriate doping densities and profiles for portion 82 depending upon the particular type of device they intend to fabricate. It is desirable that body region 84 is the same material as the drift region 70 to ensure that there is no crystal dislocation between the drift and the body region that would create electrical leakage. Selective epitaxial deposition is a preferred means of forming portion 82. Selective epitaxial deposition is conveniently performed by LPCVD, RPCVD or APCVD using di-chlorosilane or tri-chlorosilane. UHV-CVD can also be used. Selectivity is improved by use of $GeH_4$ gas mixtures. Some epitaxial lateral overgrowth (ELO) can occur when thickness 821 of portion 82 exceeds pillar height 802. Structure 54-12 results.

Depending upon the planarity obtained for upper surface 821 of the material of trench portion 82, trench portion 82 may be used as-is following deposition or it may be grown to a thickness greater than thickness 802 and lapped back to thickness 823, as shown in manufacturing stage 52-13, so that region 84 has a thickness 841 and upper surface 842 substantially coplanar with surface 801 of epi-mask pillar 80. Alternatively, if trench portion 82 is not as thick as thickness 802, pillar 80 may be lapped so that surfaces 842 and 801 (after lap) are substantially coplanar. Either arrangement is useful. Persons of skill in the art will be able to determine without undue experimentation whether such a lap-back step is needed. Chemical-mechanical polishing (CMP) is an example of a well known suitable planarization technique. Other techniques can also be used. Epi-growth mask pillar 80 is then removed, e.g., by selective etching, thereby creating cavity or trench 90. Structure 54-13 results. Since pillar 80 is of, for example, silicon oxide, it may be selectively etched without affecting adjacent semiconductor regions 83, 84. Thus, amorphization of the interior walls of trench 90 is avoided.

In manufacturing stage 52-14, the semiconductor material of adjacent regions 83, 84 surrounding trench 90 is desirably but not essentially slightly etched to round the corners of trench 90 so as to avoid high electric field concentrations at any sharp corners that may be left from the removal of pillar 80 and that might degrade the sustaining voltage of the finished device. As a consequence, modified trench 91 of width 910 slightly greater than width 803 of pillar 80 and depth 911 slightly greater than height 802 of pillar 80 is obtained, as shown in structure 54-14 of FIG. 14. Persons of skill in the art will understand how to perform such etching in order to produce the amount of corner rounding that they desire for their particular device application. Wet etching is a suitable technique for such corner rounding wherein the etchant depends upon the particular semiconductor materials being used. For the exemplary SiGe materials described herein, buffered hydrofluoric acid, hydrogen peroxide and acetic acid, is a suitable etchant mixture. As a consequence of the corner rounding etch, bottom portion 912 of trench 91 generally extends slightly below interface 412 between regions or layer 83 and superjunction structure 41. Higher mobility material 87 is then deposited so as to line the interior walls of trench 91, at least on sides 913. Structure 54-14 results.

As noted earlier, strained silicon is suitable for material 87 in connection with SiGe mixtures for body region 84. Material 87 is conveniently deposited in trench 91 to thickness 871, at least on sides 913. It may also be deposited on bottom surface 912 of trench 91 and on outer surface 842 of layer or region 84 of structure 54-13 but this is not essential. It is arranged that material 87 be strained by using a material of different composition and therefore different lattice constant than the material of region 84. If provided, the portions of material 87 on surface 842 can be later removed, but this is not essential. Thickness 871 is usefully in the range of about 30 to 100 nanometers with about 50 nanometers being preferred. Material 87 may be intrinsic, in which case it will tend to take up the doping type of the material on which it is deposited, or it may be doped during or after formation. Doping of material 87 in trench 91 is especially convenient for controlling the threshold voltage and determining whether the resulting device is an enhancement or depletion mode device. Vapor phase epitaxy or molecular beam epitaxy are examples of suitable deposition techniques for strained semiconductor material 87. LPCVD is preferred. Silicon (doped or undoped) is a non-limiting example of a suitable semiconductor (SC) for material 87 that will be strained relative to the relaxed SiGe semiconductor material of body region 84. Material 87 may be N or P type depending upon the type of finished device that is desired. For an N-channel Trench-MOS device, material 87 is preferably N-type with a doping density usefully in the range of about 1E16 per $cm^3$, more conveniently of a similar value as the drift region 70 that depends on the breakdown voltage targeted by the application. Structure 54-14 results. While material 87 is described as a strained material, this is merely a way of obtaining higher mobility material than that of body region 84 where body region 84 is of a relaxed material. Material 87 may be any material that provides a higher mobility than what would ordinarily be encountered in a channel induced in body region 84. Thus, use of a strained semiconductor for material 87 is convenient but not essential provided that material 87 has a higher mobility than the material of body region 84 for the type of carriers than will flow in channels 45 (e.g., see FIG. 2).

Figure 14:
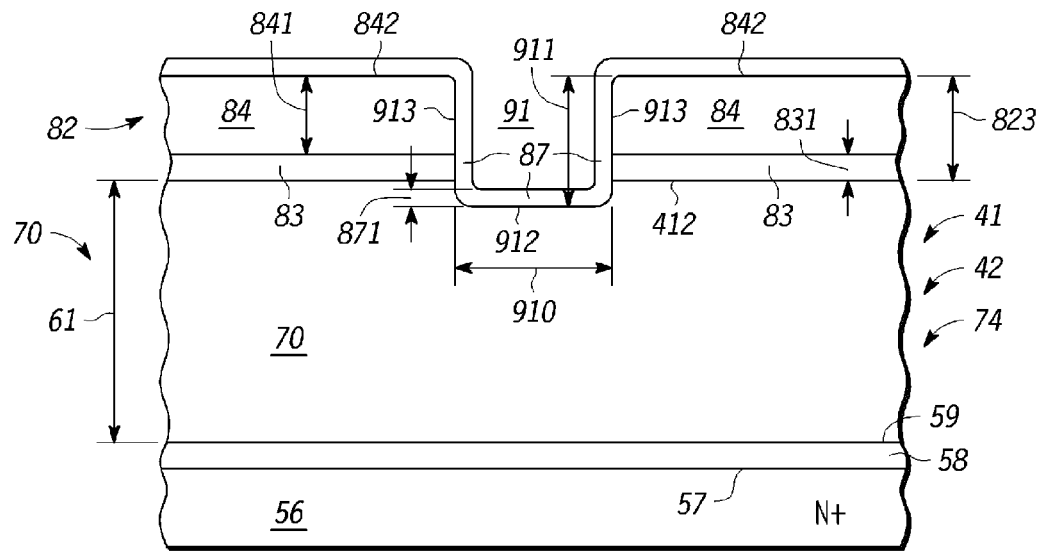
Figure 15:
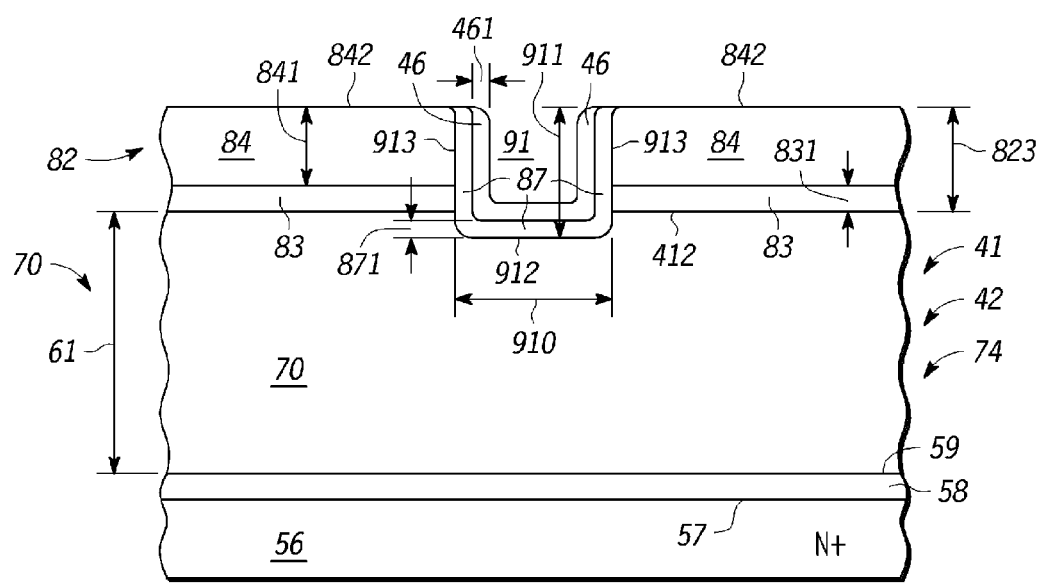
Figure 16:
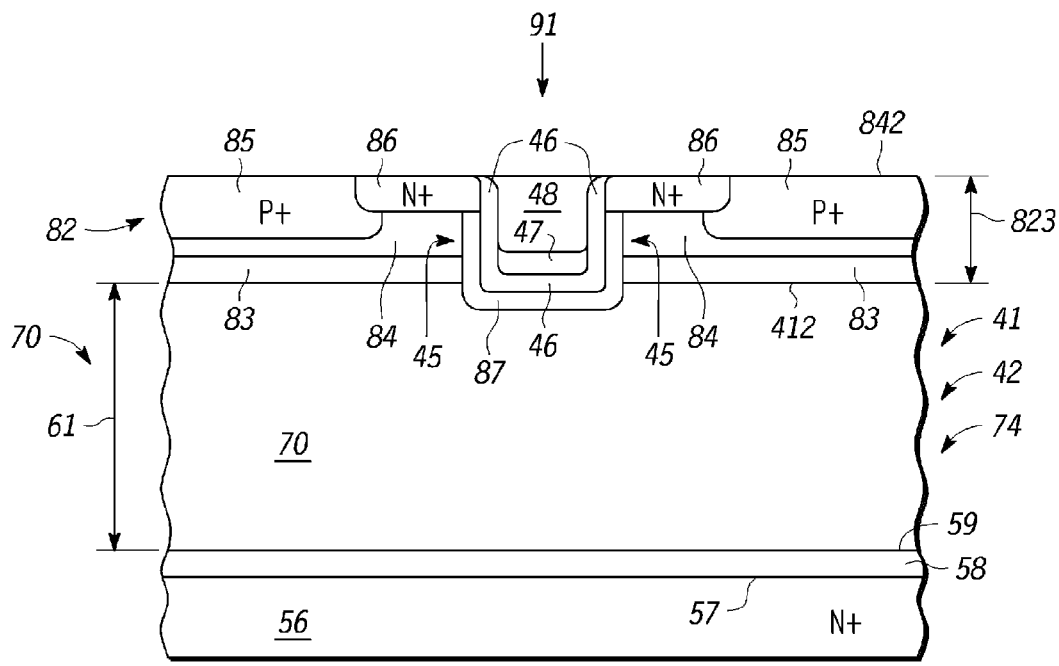
Figure 17:
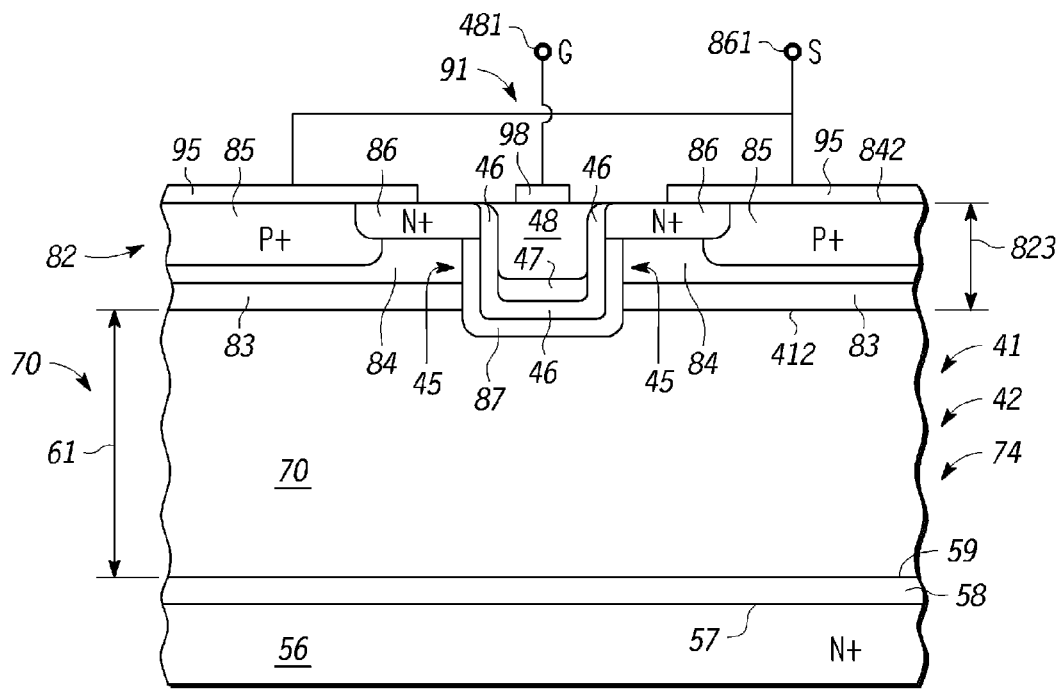

Manufacturing stage 52-15 of FIG. 15, 52-16 of FIG. 16 and 52-17 of FIG. 17 illustrates how structure 54-14 of FIG. 14 may be used to form N-channel Trench-MOS device 40 of FIG. 2 having improved properties compared to device 20 of FIG. 1. Exemplary material 87 lining trench 91 is identified as "N(s)" meaning that material 87 in trench 91 is desirably formed of a material (e.g., Si) that becomes strained when epitaxially deposited on the relaxed material (e.g., SiGe) of regions 83, 84. It is the lattice mismatch between regions 83, 84 and material 87 that creates the strain in material 87 during epitaxial growth in trench 91. P(r) regions 84 act as P−body regions analogous to P−body regions 32 of FIG. 1 extending from surface 842 into N(r) regions 83. P+body contacts 85 are conveniently formed extending from surface 842 into P(r) region 84 to reduce contact resistance to P−body regions 84 and N+ source regions 86 analogous to regions 34 of FIG. 1 are formed extending from surface 842 into P(r) region 84 and contacting higher mobility (e.g., strained) material 87. Gate dielectric 46 analogous to gate dielectric 36 of FIG. 1 is conveniently formed on the portions of N(s) layer 78 on sides 913 and bottom 912 of trench 91. Channel regions 45 analogous to channel regions 23 of FIG. 1 are located in the portions of material 87 between source regions 86 and N-type regions 83. Gate 48 is formed on gate dielectric 46 in proximity to channel regions 45 in trench 91, analogous to gate 38 of FIG. 1. Ion implantation is a non-limiting example of a suitable technique for forming regions 85, 86 with a dose of about 1E15 to 4E15 per square centimeter being suitable for body contact regions 85, and about 2E15 to 5E15 per centimeter square being suitable for source regions 86, but lower and higher doping may also be used. Thermally grown or deposited silicon oxide of about 200 to 600 Angstrom Units thickness is conveniently used for gate dielectric 46. Doped polycrystalline silicon is suitable for gate 48, but other conductors can also be used. Gate contact 98 (see FIG. 17) of for example AlSiCu is provided on gate 48. Source-body contact 95 of for example AlSiCu is provided in electrical communication with source region 86 and body contact region 85. Drain contact 96 is provided on substrate 56. Source, drain and gate connections 861, 481 and 561 are provided in electrical communication with source, gate and drain contacts 95, 98, and 96 respectively.

What is different between device 40 (also device structure 54-17) and device 20 is the presence of higher mobility (e.g., strained) semiconductor material 87 in channels regions 45 and relaxed semiconductor materials 83, 84 on which strained material 87 is formed, and, the presence of higher mobility (e.g., strained) semiconductor material regions 74 in contact with relaxed semiconductor material 70 in superjunction structure 41 in drift space 42 of device 40. When device 40 is appropriately biased, current 50 flows from sources 86 through channels 45 in higher mobility (e.g., strained) material 87 and through the higher mobility (e.g., strained) material of regions 74 of carrier drift space and through transition or buffer layer 58 to substrate 56 which acts as the drain of improved Trench-MOS device 40. $R_{DS}ON$ comprises the combined resistances of the various device regions through which currents 50 of FIG. 2 flow, analogous to currents 30 of FIG. 1. Because the carrier mobility of channel regions 45 in material 87 in trench 91 and in drift space regions 74 of superjunction structure 41 is higher than the carrier mobility in comparable regions of prior art device 20, $R_{DS}ON$ is reduced. For the same device geometry, e.g., gate area, gate dielectric thickness, etc., Qgd is substantially the same, but the figure of merit (FOM)=$R_{DS}ON*Qgd$ is improved. The FOM can be further improved by including thicker dielectric region 47 in the bottom of trench 91, thereby further decoupling gate 48 from superjunction structure 41 and drain 56. This provides additional improvement in the FOM by further reducing Qgd. Region 47 may also be made of a material with a lower permittivity than gate dielectric 46, thus, still further reducing Qgd. Other things being equal, the lower the figure of merit the faster the device can operate.

Structure 54-14 shown in FIG. 14 is preferably obtained through the manufacturing sequence illustrated in manufacturing stages 52-11 through 52-14. This has the advantage that an anisotropic semiconductor etch is not required and the risk of amorphization of the trench surfaces where higher mobility material 87 is intended to be deposited and wherein the device channels will form is avoided. Further, the depth of trench 90 may be more carefully controlled since it is determined by thickness or height 802 of pillar 80, which provides a convenient etch and/or lap stop in conjunction with any back-lap steps. This is in contrast to merely etching trench 90 where etch depth is usually determined merely by etch time, a less precise means of control of trench depth. However, trench 90 may also be formed in other ways. For example, structure 54-13 illustrated in FIG. 13 can be formed without epi-growth mask pillar 80, that is, layers 83, 84 merely deposited or grown on surface 412 without involving epi growth mask pillar 80. Then trench 90 is etched into surface 842 of layers 83, 84, thereby yielding structure 54-13 of FIG. 13. From that point on, manufacturing stages 52-14 through 52-17 are performed as previously described. As previously noted, such process is prone to undesirable amorphization of the trench sidewalls during RIE of trench 90. However, if the RIE damaged side-wall material is removed using the relatively gentle isotropic etch step to obtain structure 54-14 depicted in manufacturing stage 52-14, higher mobility (e.g., strained) semiconductor material 87 can be deposited on a fresh surface unaffected by RIE and the adverse affects of amorphization avoided. With this approach, the substantially isotropic etch step included in manufacturing stage 52-14 should remove not only enough material for corner rounding but also enough material to remove any RIE etch damage, whichever is greater. Either approach is useful.

The manufacturing sequence illustrated by manufacturing stages 52-12 through 52-17, show body contact region 85 and source regions 86 being provided after material 87 is deposited in trench 91. While this is preferred it is not essential. Body contact regions 85 and sources 86 may be formed, for example, by ion implantation (or other doping technique) into structure 54-13 of FIG. 13 when body region 84 is formed, followed by the remainder of manufacturing stages 52-14 through 52-17 or at other manufacturing stages. Also, while it is convenient to use in-situ doping during growth of trench region 82 to provide body region 84, this also is not essential. trench region 82 may be formed of a single conductivity type (e.g., N-type) and then (e.g., P) body region 84 formed by ion implantation or other doping means into, for example, substantially planarized structure 54-13 of stage 52-13. Either arrangement is useful.

Figure 18:
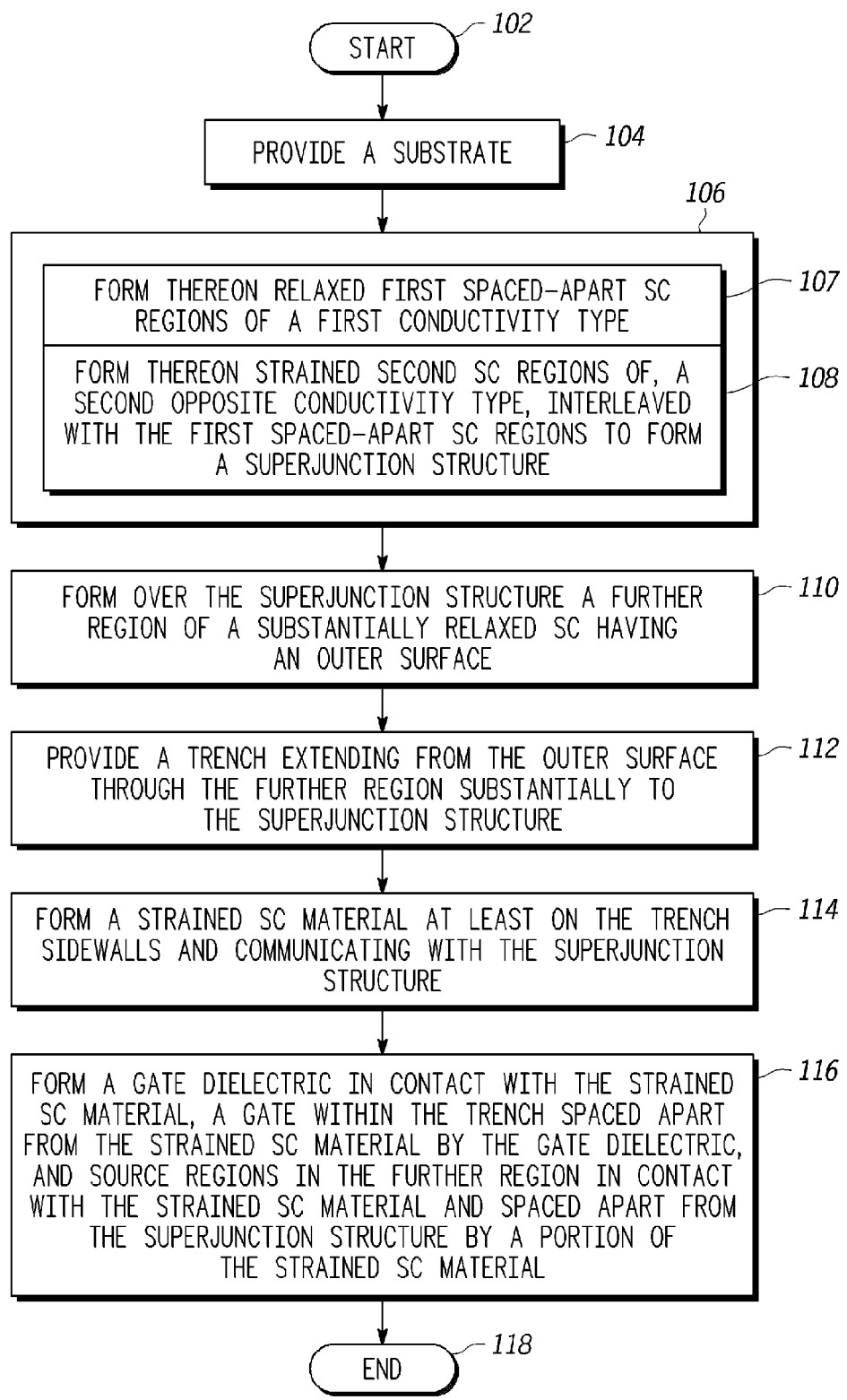
FIGS. 18-19 are simplified flow diagrams illustrating methods for forming the structures illustrated in FIGS. 2-17, according to yet further embodiments.
Figure 19:
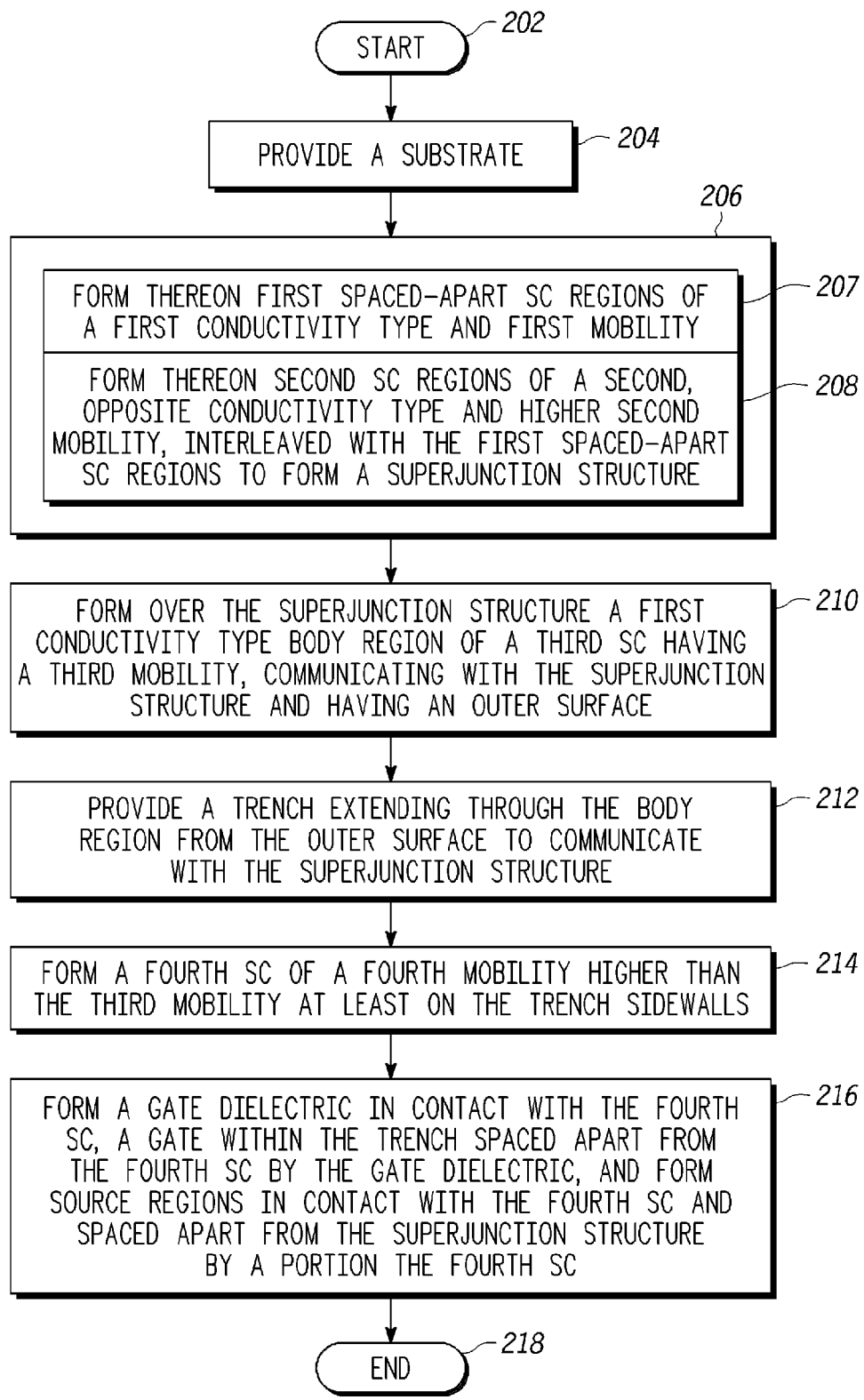

FIGS. 18-19 are simplified flow diagram illustrating methods 100 and 200 for forming the structures illustrated in FIGS. 3-17, according to still further embodiments. Referring now to FIG. 18, method 100 begins with START 102 and initial PROVIDE A SUBSTRATE step 104, e.g., substrate 56 with or without buffer layer 58. Single crystal silicon is a non-limiting example of a suitable substrate material, but other materials can also be used. Non-limiting examples are SiC, Ge, GaAs, GaN, AlN, InN, BP, InP, etc. As has already been explained, SiGe is an example of a suitable material for buffer layer 58, but other materials such as those listed above may also be used. In step 106, comprising sub-steps 107, 108 that may be performed in either order, the first and second spaced-apart, interleaved semiconductor regions (e.g., regions 70, 74) having, for example, relaxed and strained lattice characteristics are formed. In sub-step 107, first spaced-apart (e.g., relaxed) semiconductor (abbreviated as "SC") regions of a first doping type (either N or P) are formed on the substrate. In sub-step 108, second spaced-apart (e.g., strained) semiconductor (SC) regions of a second doping type opposite the first doping type are formed interleaved with the first spaced-apart regions to form a superjunction structure. The first and second interleaved SC regions may be formed in either order, that is, the first (e.g., relaxed) SC regions may be formed first and the second (e.g., strained) SC regions may be formed second. This is the sequence illustrated in FIGS. 3-10, but this is not essential. Alternatively, the second (e.g., strained) spaced-apart SC regions may be formed first and the first (e.g., relaxed) spaced-apart SC regions may be formed second, interleaved with the second regions. Either arrangement is useful. This provides superjunction structure 54-10 of FIG. 10. In subsequent step 110, a further region of for example, substantially relaxed semiconductor (SC) (e.g., regions 83, 84) is formed over the superjunction structure, and having an outer surface, e.g., surface 842. In step 112, a trench is formed extending from the outer surface through the further region substantially to the superjunction structure. As previously described an isotropic etch may optionally be used to round the corners of this trench and/or eliminate any amorphous surface material resulting from trench formation, depending upon the particular process used to form the trench. In step 114, at least the trench sides are lined with e.g., strained semiconductor (SC) material (e.g., material 87) relative to the body region through which the trench passes, and in communication with the superjunction structure. Then in step 116, the gate dielectric is formed over the e.g., strained SC material, the remainder of the trench desirably filled with the gate material and source regions and body contract regions provided in the further region so that the source regions are electrically coupled to the e.g., strained SC material and spaced apart from the superjunction structure so that current flow is via the e.g., strained SC material between the source regions and the drift space provided by the superjunction structure. Method 100 then proceeds to END 118, however, persons of skill in the art will understand that various post-processing steps may also be performed to provide electrodes or electrical contacts to the various device regions, surface passivation, packaging and so forth. Such post-processing steps are well known in the art.

Referring now to FIG. 19, method 200 begins with START 202 and initial PROVIDE A SUBSTRATE step 204, e.g., substrate 56 with or without buffer layer 58. Single crystal silicon is a non-limiting example of a suitable substrate material, but other materials can also be used. Non-limiting examples are SiC, Ge, GaAs, GaN, AlN, InN, BP, InP, etc. As has already been explained, SiGe is an example of a suitable material for buffer layer 58, but other materials, for example, one or more of those listed above may also be used. In step 206, comprising sub-steps 207, 208 that may be performed in either order, the first and second spaced-apart, interleaved semiconductor regions (e.g., regions 70, 74) having first and seconds mobilities are formed. In sub-step 207, first spaced-apart semiconductor (abbreviated as "SC") regions (e.g., regions 70) of a first doping type (either N or P) and a first mobility are formed on the substrate. In sub-step 208, second spaced-apart semiconductor (SC) regions (e.g., regions 74) of a second doping type opposite the first doping type and a higher second mobility for the same carriers are formed interleaved with the first spaced-apart regions to form a superjunction structure. The first and second interleaved SC regions may be formed in either order, that is, the first (e.g., relaxed) SC regions may be formed first and the second (e.g., strained) SC regions may be formed second. This is the sequence illustrated in FIGS. 3-10, but this is not essential. Alternatively, the second higher mobility spaced-apart SC regions may be formed first and the first spaced-apart SC regions of the first (lower) mobility may be formed second, interleaved with the second regions. Either arrangement is useful. This provides superjunction structure 54-10 of FIG. 10. In subsequent step 210, a body region of a third SC having a third mobility, communicating with the superjunction structure and having an outer surface (e.g., surface 842) is formed over the superjunction structure. In step 212, a trench (e.g., trench 90, 91) is formed extending from the outer surface through the body region to communicate with the superjunction structure. The first and third SC regions may be formed of substantially the same material, but this is not essential, provided they have higher mobility than their counterpart second and fourth SC material or regions. As previously described an isotropic etch may optionally be used to round the corners of this trench and/or eliminate any amorphous surface material resulting from trench formation, depending upon the particular process used to form the trench. In step 214, at least the trench sides are lined with a fourth semiconductor (SC) material of a fourth higher mobility than the third mobility of the body region through which the trench passes. Then in step 216, the gate dielectric is formed over the fourth SC material, the remainder of the trench desirably filled with the gate material insulated from the trench sides by the gate dielectric, and source regions and body contract regions provided so that the source regions are electrically coupled to the fourth SC material and spaced apart from the superjunction structure so that current flow is via the fourth SC material between the source regions and the drift space provided by the superjunction structure. Method 200 then proceeds to END 218, however, persons of skill in the art will understand that various post-processing steps may also be performed to provide electrodes or electrical contacts to the various device regions, surface passivation, packaging and so forth. Such post-processing steps are well known in the art. As previously noted the source regions and body contact regions may be formed at any stage of the method 200 after formation of the body region.

According to a first embodiment, there is provided a method for forming a trench-type semiconductor device embodying a superjunction structure, comprising, in either order, forming first spaced-apart regions of a first semiconductor material having a first conductivity type and a first lattice constant, forming second spaced-apart regions of a second semiconductor material interleaved with the first space-apart regions, and having a second different conductivity type and a second different lattice constant so that the second semiconductor material in the second regions is strained with respect to the first semiconductor material in the first regions and one or more PN junctions exists therebetween, and providing a further region of substantially relaxed semiconductor material in contact with the first and second spaced-apart interleaved regions and having an outer surface, forming a trench in the further region extending from the outer surface substantially to the first and second spaced-apart interleaved regions, providing a strained semiconductor material on at least the side-walls of the trench, forming a gate dielectric over the strained semiconductor material, providing a gate in contact with the gate dielectric, spaced apart thereby from the strained semiconductor material, and providing one or more source regions communicating with the strained semiconductor material and separated from the first and second spaced-apart interleaved regions by a portion of the strained semiconductor material. In a yet further embodiment, the method further comprises before the forming steps, providing a substrate of a predetermined lattice constant having a principal surface, and providing on the principal surface a graded semiconductor layer having an inner surface against the principal surface and an outer surface distant from the inner surface adapted to receive the first spaced-apart regions and having a lattice constant at the outer surface that substantially matches the first lattice constant so that the first semiconductor material of the first regions formed on a first part of the outer surface is substantially relaxed. In a yet still further embodiment, the lattice constant at the outer surface is different from the second lattice constant so that the second material of the second regions formed on a second part of the outer surface is strained. In still further embodiment, the first semiconductor material comprises SiGe and the second semiconductor material comprises Si with less than 5% Ge. In a still yet further embodiment the first semiconductor material comprises Si:Ge ratios in the range of about 60:40 to 95:05. In another embodiment, the first semiconductor material comprises Si:Ge ratios in the range of about 70:30 to 90:10. In a yet another embodiment, the first semiconductor material comprises a Si:Ge ratios of about 80:20 to 85:15.

In a second embodiment there is provided a method for forming a semiconductor device, comprising, providing a substrate having an outer surface, forming on the outer surface, first spaced-apart semiconductor regions of a first conductivity type and first mobility\, forming on the outer surface second semiconductor regions of a second opposite conductivity type and higher second mobility, interleaved with the first spaced-apart semiconductor regions to form a superjunction structure, forming over the superjunction structure a first conductivity type body region of a third semiconductor having a third mobility, communicating with the superjunction structure and having an outer surface, providing a trench extending through the body region from the outer surface to communicate with the superjunction structure, and forming a fourth semiconductor region of a fourth mobility higher than the third mobility at least on the trench sidewalls. In a further embodiment the method further comprises forming a gate dielectric in contact with the fourth semiconductor region. In a still further embodiment, the method comprises forming a gate within the trench separated from the fourth semiconductor material by the gate dielectric. In a still yet further embodiment the method further comprises anytime after forming the body region, providing one or more source regions within the body region in contact with the fourth semiconductor region and separated from the superjunction structure by a portion of the fourth semiconductor region.

In a third embodiment there is provided a semiconductor device, comprising, a superjunction structure having interleaved regions of first and second semiconductor materials of opposite conductivity type and first and second mobilities, wherein the first and second semiconductor materials are separated by substantially parallel PN junctions and terminated at a first end by a substrate region substantially perpendicular to the PN junctions, wherein the superjunction structure has a second end spaced apart from the first end and wherein the second mobility is higher than the first mobility for the same carrier type, a body regions of a third semiconductor material of a third mobility, coupled to the second end and having an outer surface opposed to the second end, a trench having sidewalls extending from the outer surface at least to the second end, and a fourth material of a fourth mobility higher than the third mobility for the same type of carrier at least on the sidewalls, and communicating with the superjunction structure. In a further embodiment the first semiconductor material is a relaxed semiconductor material and the second semiconductor material is a strained semiconductor material. In a still further embodiment the third semiconductor material is a relaxed semiconductor material and the fourth semiconductor material is a strained semiconductor material. In a yet still further embodiment, the first and third semiconductor materials comprise SiGe and the second and fourth material is substantially silicon with less than 5% Ge. In a yet further embodiment the first and third semiconductor materials comprise Si:Ge in the ratio of X fraction Si to Y fraction Ge where X:Y ratios are in the range of 60:40 to 95:05. In a still yet further embodiment, Si:Ge ratios are in the range 70:30 to 90:10. In another embodiment, the substrate comprises a first substantially silicon region with a Si:Ge transition layer of varying composition located between the first substantially silicon region and the superjunction structure. In yet another embodiment, the transition has a composition next to the first substantially silicon region of substantially silicon and a composition next to the superjunction structure that substantially matches the composition of the first semiconductor material. In still another embodiment, the device further comprises, a first dielectric material at least on the fourth material on the sidewalls of the trench, and in a bottom portion of the trench, a second dielectric material of lower capacitance per unit area than the first dielectric.

While at least one exemplary embodiment has been presented in the foregoing detailed description, it should be appreciated that a vast number of variations exist, especially with respect to choices of device types and materials and sequence of steps. The above-described embodiments may be especially useful for formation of Trench-MOS devices, but persons of skill in the art will understand based on the description here in that other types of devices can also be fabricated using the principles described herein. For example, and not intended to be limiting, embodiments are useful for fabrication of Diode, BJT, IGBT and Thyristor devices as well as those described herein. Further, while Si and SiGe are provided as examples of suitable materials for use in combination to produce the adjacent relaxed (lower mobility) and strained (higher mobility) semiconductor regions described herein, this is merely be way of example and not intended to be limiting. The following is a non-limiting list of other suitable semiconductor materials that can be used in combination to achieve analogous lower mobility regions and higher mobility regions in a superjunction and trench configuration, specifically: GaN and Si, InGaN and GaN, InAsP and InP, SiC and AlN, SiC and BP, SiGe and GaAs, GaAs and Ge, Si and $Si_{1-y}C_y$, and so forth. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A method for forming a trench-type semiconductor device embodying a superjunction structure, comprising:
    forming interleaved regions by, in either order;
        forming first spaced-apart regions of a first semiconductor material having a first conductivity type and a first lattice constant, and
        forming second spaced-apart regions of a second semiconductor material interleaved with the first space-apart regions, and having a second different conductivity type and a second different lattice constant so that the second semiconductor material in the second regions is strained with respect to the first semiconductor material in the first regions and one or more PN junctions exists therebetween;
    providing a further region of substantially relaxed semiconductor material in contact with the first and second spaced-apart regions and having an outer surface;
    forming a trench having sidewalls in the further region extending from the outer surface substantially to the first and second spaced-apart regions;
    providing a strained semiconductor material on at least the sidewalls of the trench;
    forming a gate dielectric over the strained semiconductor material;
    providing a gate in contact with the gate dielectric, spaced apart thereby from the strained semiconductor material; and
    providing one or more source regions communicating with the strained semiconductor material and separated from the first and second spaced-apart regions by a portion of the strained semiconductor material.

2. The method of claim 1, further comprising before the forming steps:
    providing a substrate of a predetermined lattice constant having a principal surface; and providing on the principal surface a graded semiconductor layer having an inner surface against the principal surface and an outer surface distant from the inner surface adapted to receive the first spaced-apart regions and having a lattice constant at the outer surface that substantially matches the first lattice constant so that the first semiconductor material of the first regions formed on a first part of the outer surface is substantially relaxed.

3. The method of claim 2, wherein the lattice constant at the outer surface is different from the second lattice constant so that the second material of the second regions formed on a second part of the outer surface is strained.

4. The method of claim 1, wherein the first semiconductor material comprises SiGe and the second semiconductor material comprises Si with less than 5% Ge.

5. The method of claim 4, wherein the first semiconductor material comprises Si:Ge ratios in the range of about 60:40 to 95:05.

6. The method of claim 5, wherein the first semiconductor material comprises Si:Ge ratios in the range of about 70:30 to 90:10.

7. The method of claim 6, wherein the first semiconductor material comprises a Si:Ge ratios of about 80:20 to 85:15.

8. A method for forming a semiconductor device, comprising:
   providing a substrate having an outer surface;
   forming on the outer surface, first spaced-apart semiconductor regions of a first conductivity type and first mobility;
   forming on the outer surface second semiconductor regions of a second opposite conductivity type and higher second mobility, interleaved with the first spaced-apart semiconductor regions to form a superjunction structure;
   forming over the superjunction structure a first conductivity type body region of a third semiconductor having a third mobility, communicating with the superjunction structure and having an outer surface;
   providing a trench having sidewalls extending through the body region from the outer surface to communicate with the superjunction structure; and
   forming a fourth semiconductor region of a fourth mobility higher than the third mobility at least on the sidewalls of the trench.

9. The method of claim 8, further comprising, forming a gate dielectric in contact with the fourth semiconductor region.

10. The method of claim 9, further comprising, forming a gate within the trench separated from the fourth semiconductor material by the gate dielectric.

11. The method of claim 10, further comprising, at any time after forming the body region, providing one or more source regions within the body region in contact with the fourth semiconductor region and separated from the superjunction structure by a portion of the fourth semiconductor region.

12. A method for forming a trench-type semiconductor device embodying a superjunction structure, comprising:
   forming a superjunction structure having interleaved regions of first and second semiconductor materials of opposite conductivity type and first and second mobilities, wherein the first and second semiconductor materials are separated by substantially parallel PN junctions and terminated at a first end by a substrate region substantially perpendicular to the PN junctions, wherein the superjunction structure has a second end spaced apart from the first end, and wherein the second mobility is higher than the first mobility for a same carrier type;
   forming a body regions of a third semiconductor material of a third mobility, coupled to the second end and having an outer surface opposed to the second end;
   forming a trench extending from the outer surface at least to the second end, wherein the trench has sidewalls; and
   forming a fourth material at least on the sidewalls, wherein the fourth material has a fourth mobility higher than the third mobility for the same type of carrier, and the fourth material is formed in communication with the superjunction structure.

13. The method of claim 12, wherein the first semiconductor material is a relaxed semiconductor material and the second semiconductor material is a strained semiconductor material.

14. The method of claim 13, wherein the third semiconductor material is a relaxed semiconductor material and the fourth semiconductor material is a strained semiconductor material.

15. The method of claim 14, wherein the first and third semiconductor materials comprise SiGe and the second and fourth material is substantially silicon with less than 5% Ge.

16. The method of claim 15, wherein the first and third semiconductor materials comprise Si:Ge in the ratio of X fraction Si to Y fraction Ge where X:Y ratios are in the range of 60:40 to 95:05.

17. The method of claim 16, wherein Si:Ge ratios are in the range of 70:30 to 90:10.

18. The method of claim 12, wherein the substrate comprises a first substantially silicon region with a Si:Ge transition layer of varying composition located between the first substantially silicon region and the superjunction structure.

19. The method of claim 18, wherein the transition has a composition next to the first substantially silicon region of substantially silicon and a composition next to the superjunction structure that substantially matches the composition of the first semiconductor material.

20. The method of claim 12, further comprising forming a first dielectric material at least on the fourth material on the sidewalls of the trench, and in a bottom portion of the trench.

* * * * *